(12) United States Patent
Chuang et al.

(10) Patent No.: US 8,701,070 B2
(45) Date of Patent: Apr. 15, 2014

(54) GROUP BOUNDING BOX REGION-CONSTRAINED PLACEMENT FOR INTEGRATED CIRCUIT DESIGN

(75) Inventors: Yi-Lin Chuang, Taipei (TW); Chun-Cheng Ku, Zhubei (TW); Yun-Han Lee, Hsinchu (TW); Shao-Yu Wang, Hsin-chu (TW); Wei-Pin Changchien, Taichung (TW); Chin-Chou Liu, Jhubei (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 0 days.

(21) Appl. No.: 13/613,678

(22) Filed: Sep. 13, 2012

(65) Prior Publication Data
US 2014/0075404 A1 Mar. 13, 2014

(51) Int. Cl.
*G06F 17/50* (2006.01)
(52) U.S. Cl.
USPC ........... 716/118; 716/110; 716/119; 716/126; 716/132; 716/134; 716/135
(58) Field of Classification Search
USPC .......... 716/110, 118–119, 126, 132, 134–135
See application file for complete search history.

(56) References Cited

U.S. PATENT DOCUMENTS

| | | | | |
|---|---|---|---|---|
| 6,240,541 | B1 * | 5/2001 | Yasuda et al. | 716/112 |
| 6,317,863 | B1 * | 11/2001 | Segal | 716/122 |
| 6,351,840 | B1 * | 2/2002 | Teng | 716/122 |
| 6,442,743 | B1 * | 8/2002 | Sarrafzadeh et al. | 716/122 |
| 6,754,877 | B1 * | 6/2004 | Srinivasan | 716/114 |
| 6,799,309 | B2 * | 9/2004 | Dhanwada et al. | 716/122 |
| 6,996,793 | B1 * | 2/2006 | Kronmiller et al. | 716/55 |
| 7,904,840 | B2 * | 3/2011 | Tang | 716/132 |
| 2002/0138816 | A1 * | 9/2002 | Sarrafzadeh et al. | 716/11 |
| 2003/0018947 | A1 * | 1/2003 | Teig et al. | 716/7 |
| 2003/0023935 | A1 * | 1/2003 | McManus et al. | 716/1 |
| 2003/0079192 | A1 * | 4/2003 | Cheong et al. | 716/7 |
| 2005/0076319 | A1 * | 4/2005 | Chow et al. | 716/10 |
| 2005/0097489 | A1 * | 5/2005 | Seward | 716/9 |
| 2006/0123370 | A1 * | 6/2006 | Vergara-Escobar | 716/6 |
| 2006/0156266 | A1 * | 7/2006 | Alpert et al. | 716/13 |
| 2006/0242613 | A1 * | 10/2006 | Fukazawa | 716/8 |

(Continued)

OTHER PUBLICATIONS

Hong, Bongghi et al., "Calculating area weighted means with ArcGIS", Jul. 19, 2007. pp. 1-8.*

(Continued)

*Primary Examiner* — Stacy Whitmore
(74) *Attorney, Agent, or Firm* — Cooper Legal Group LLC

(57) ABSTRACT

Among other things, one or more systems and techniques for defining a group bounding box for related cells of an integrated circuit, and generating a new layout for the integrated circuit comprising the group bounding box are provided herein. That is, one or more group bounding boxes are defined based upon positional values of related cells. Such group bounding boxes are placed within the new layout based upon a placement technique, such as an objective function that takes into account wire length, timing, and cell density, for example. The one or more group bounding boxes are sized or reshaped to reduce cell overlap within the new layout. In this way, the new layout comprises related cells, bound by one or more group bounding boxes, that are placed within the new layout according to a configuration that mitigates wire length and timing delay of the integrated circuit.

20 Claims, 8 Drawing Sheets

(56) References Cited

U.S. PATENT DOCUMENTS

2007/0094627 A1* 4/2007 Komoda .................. 716/10
2007/0245281 A1* 10/2007 Riepe et al. .................. 716/9
2007/0266359 A1* 11/2007 Esbensen et al. ............... 716/10
2008/0276209 A1* 11/2008 Albrecht et al. ................ 716/6
2011/0252389 A1* 10/2011 Albrecht et al. ............. 716/108
2012/0241986 A1* 9/2012 Sherlekar et al. ............. 257/784

OTHER PUBLICATIONS

Electronic design automation, Retrieved on Aug. 16, 2012, pp. 1-6, http://en.wikipedia.org/wiki/Electronic_design_automation.

* cited by examiner

GROUP BOUNDING BOX REGION-CONSTRAINED PLACEMENT FOR INTEGRATED CIRCUIT DESIGN

BACKGROUND

Electronic design tools, such as electronic design automation (EDA) tools, allow designers to design, simulate, and analyze electronic components, such as integrated circuits. For example, a designer can create a macro floor plan for an integrated circuit using an EDA tool. The macro floor plan comprises a macroscopic layout of one or more cells configured to implement logic or electronic functions using particular integrated circuit technology. The EDA tool performs placement of cells within a layout, which can be used for simulation or a physical layout for fabrication. The layout can be simulated to perform timing analysis to determine whether the layout performs within particular timing constraints. To further improve design performance, the designer can specify constraints, such as bound locations and sizes, within which cells are to be placed. However, conventional EDA tools cannot automatically determine such constraints or have limited capability for placement of cells based upon constraints, which leaves this task to designers for manual handling. However, because the designer does not know what bound locations and sizes are most efficient, such as a layout resulting in a relatively fast circuit design, the designer can iteratively adjust bound locations and sizes based upon multiple simulations. Such an iterative process can take months to complete.

SUMMARY

This summary is provided to introduce a selection of concepts in a simplified form that are further described below in the detailed description. This summary is not intended to identify key factors or essential features of the claimed subject matter, nor is it intended to be used to limit the scope of the claimed subject matter.

Among other things, one or more techniques and methods for defining a group bounding box for one or more cells of an integrated circuit and creating a new layout for the integrated circuit are provided. In some embodiments of defining a group bounding box for one or more cells of an integrated circuit, a macro floor plan for the integrated circuit is received. For example, a designer can create the macro floor plan comprising an initial layout of one or more cells of the integrated circuit. To aid in creating a new layout from the macro floor plan, a group bounding box for one or more first related cells of the initial layout is defined. For example, the group bounding box is defined based upon a centroid, a width, and a height associated with the one or more first related cells. The centroid is identified based upon an average of center values for the one or more first related cells. The width and height are identified based upon a total cell area and a bound aspect ratio. In this way, a boundary for the group bounding box is defined based upon the centroid, the width, and the height. The one or more first related cells are projected along the boundary. In this way, the group bounding box is used to create the new layout for the integrated circuit, such that a placement location and size of the group bounding box can influence where the one or more first related cells are placed within the new layout.

In some embodiments, one or more group bounding boxes are defined for the new layout. For example, a second group bounding box for one or more second related cells of the initial layout is defined. The one or more group bounding boxes are placed within the new layout based upon one or more timing paths between related cells of group bounding boxes. For example, a timing path between a first related cell of the first group bounding box and a second related cell of the second group bounding box is identified. The timing path and other timing paths are taken into account during placement of one or more group bounding boxes within the new layout, such that timing delay of the integrated circuit is mitigated, which can improve computational speed of the integrated circuit. For example, an objective function, defined according to an objective and a constraint, is used to place the one or more group bounding boxes within the new layout. The objective is based upon a wire length parameter or a timing parameter, and the constraint is based upon a density parameter for group bounding box overlap. In this way, the new layout comprises one or more cells bounded by one or more group bounding boxes that are automatically placed and sized within the new layout, such as within a few days, for example, whereas conventional techniques take several months.

The following description and annexed drawings set forth certain illustrative aspects and implementations. These are indicative of but a few of the various ways in which one or more aspects may be employed. Other aspects, advantages, and/or novel features of the disclosure will become apparent from the following detailed description when considered in conjunction with the annexed drawings.

DESCRIPTION OF THE DRAWINGS

Aspects of the disclosure are understood from the following detailed description when read with the accompanying drawings. It will be appreciated that elements, structures, etc. of the drawings are not necessarily drawn to scale. Accordingly, the dimensions of the same may be arbitrarily increased or reduced for clarity of discussion, for example.

DETAILED DESCRIPTION

Figure 1:
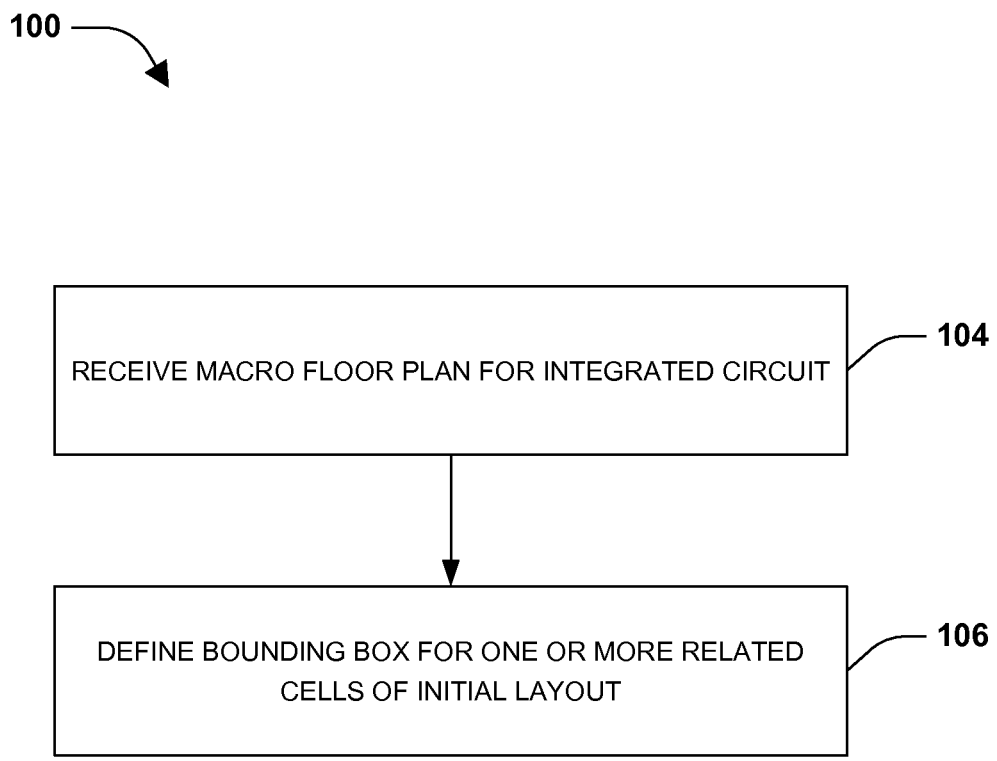
FIG. 1 is a flow diagram illustrating a method of defining a group bounding box for one or more cells of an integrated circuit, according to some embodiments.

The claimed subject matter is now described with reference to the drawings, wherein like reference numerals are generally used to refer to like elements throughout. In the following description, for purposes of explanation, numerous specific details are set forth in order to provide a thorough understanding of the claimed subject matter. It may be evident, however, that the claimed subject matter may be practiced without these specific details. In other instances, structures and devices are illustrated in block diagram form in order to facilitate describing the claimed subject matter.

Defining a group bounding box for one or more cells of an integrated circuit in accordance with various embodiments of the present disclosure is illustrated by an exemplary method 100 in FIG. 1. At 104, a macro floor plan for the integrated circuit is received. The macro floor plan comprises an initial layout of the integrated circuit. For example, the macro floor plan comprises a macroscopic layout of one or more cells of the integrated circuit, such as a cell configured to implement logic or electronic functionality. Because a designer of the macro floor plan may not have placed the one or more cells within the initial layout based upon in-depth timing analysis feedback, a new layout can be created that comprises the one or more cells that are placed according to one or more group bounding boxes that are located and are sized to mitigate timing delay of the integrated circuit.

Accordingly, to facilitate placement of the one or more cells within the new layout with improve timing for the integrated circuit, such as by reducing wire length or signal delay, for example, a group bounding box for one or more first related cells of the initial layout is defined, at 106. In an example, the one or more first related cells are identified based upon a bound configuration for the macro floor plan, such as a bound configuration file specifying that the group bounding box is to be created for the one or more first related cells. However, the bound configuration file does not comprise an optimized location, size, or configuration for the group bounding box.

Figure 4:
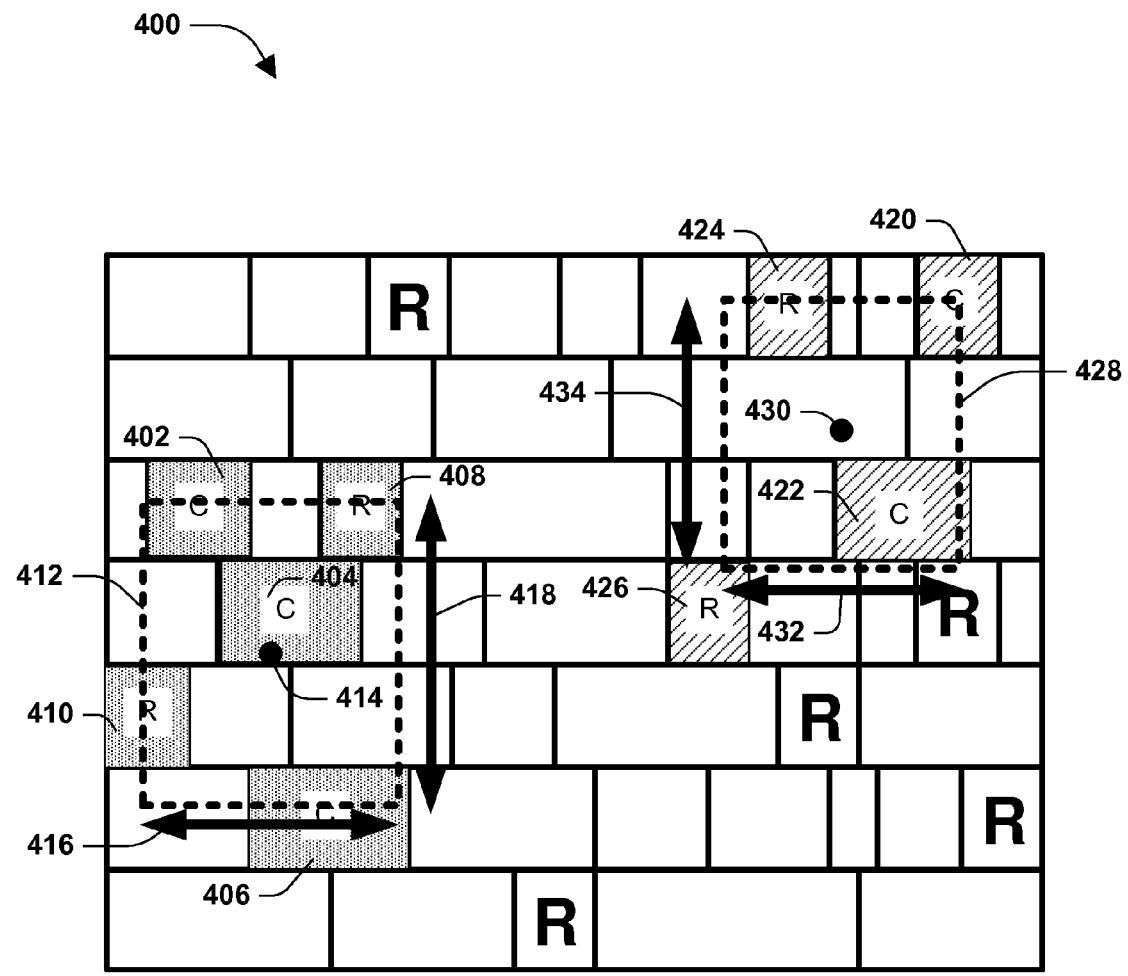
FIG. 4 is an illustration of an example of a first group bounding box and a second group bounding box for a set of cells or macros, according to some embodiments.

In an example of defining the group bounding box, a centroid for the one or more first related cells is identified based upon an average of center values for the one or more first related cells. For example, a first centroid 414 for a group bounding box 412 and a second centroid 430 for a second group bounding box 428 as illustrated in FIG. 4 are identified. A width "W" for the group bounding box is identified based upon a total cell area "$A_{sum}$" and a bound aspect ratio "p=Height/Width". For example, the width is set to a square root of the total cell area divided by the bound aspect ratio $$"w = \sqrt{\frac{Asum}{p}}".$$

A height "h" for the group bounding box is identified based upon the total cell area and the bound aspect ratio. For example, the height is a square root of the total cell area multiplied by the bound aspect ratio $$"e.g., h = \sqrt{Asum \times p}".$$

In this way, a boundary for the group bounding box is defined based upon the centroid, the width, and the height. One or more first related cells with inter-box timing properties, such as registers, for example, are projected along the boundary of the group bounding box at virtual pins. In an example, if a first related cell is outside the boundary, then a projection from a centroid of the bouncing box through a projection point along the first boundary to the first related cell is performed to identify a location for a first virtual pin of the first related cell at the projection point along the boundary. For example, projection 508 identifies a fourth virtual pin 510 in FIG. 5). In this way, the one or more first related cells are located along the boundary of the group bounding box at virtual pins.

Figure 5:
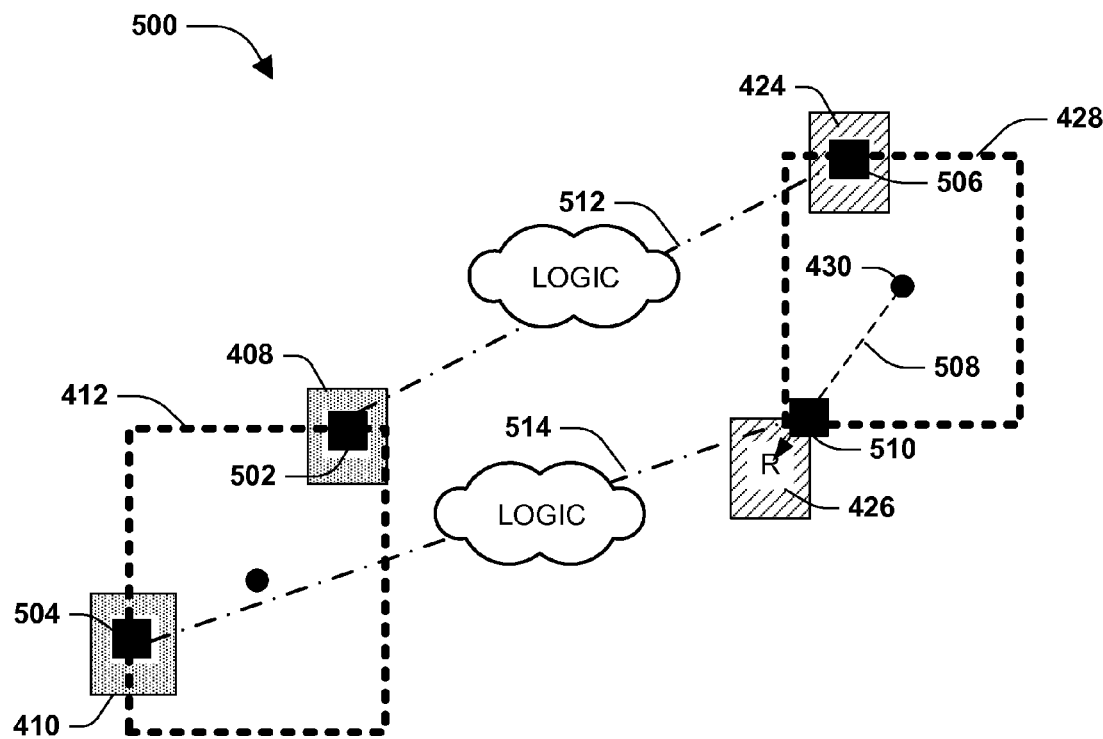
FIG. 5 is an illustration of an example of identifying a first timing path and a second timing path, according to some embodiments.

Because the integrated circuit can comprise multiple related cell sets, a second group bounding box for one or more second related cells of the initial layout is defined. Timing information associated with connections between cells of the integrated circuit can be utilized during placement of the first group bounding box, the second group bounding box, or other group bounding boxes within the new layout. In an example, a timing path between a first related cell, such as a first register, of the first group bounding box and a second related cell, such as a second register, of the second group bounding box is identified. For example, a first timing path 512 and a second timing path 514 as illustrated in FIG. 5 are identified. The timing path relates to a connection, such as a wire or logic, between the first related cell and the second related cell. In an example of identifying a timing path, a first virtual pin for the first related cell is projected along a first boundary of a first group bounding box, and a second virtual pin for the second related cell is projected along a second boundary of the second group bounding box. In this way, the timing path between the first virtual pin and the second virtual pin is identified.

Timing paths are taken into account when placing one or more group bounding boxes within the new layout because the timing paths can be evaluated to determine timing parameters or wire length parameters that are used to identify a desired placement of cells that mitigates timing delay of the integrated circuit. For example, the first group bounding box is placed with respect to the second group bounding box within the new layout, such that a wire length parameter or a timing parameter is below a threshold value. In this way, the first group bounding box is placed at a location that reduces wire length or timing delay of one or more first related cells bound to the first group bounding box. In an example of placing a group bounding box, an objective function is applied to one or more group bounding boxes to determine a placement for the group bounding box within the new layout. The objective function is based upon an objective and a constraint. The objective is defined based upon a wire length parameter or a timing parameter in order to achieve a reduced wire length or timing delay. The constraint is based upon a density parameter for group bounding box overlap in order to achieve a substantially regular distribution of group bounding boxes without substantial overlap of group bounding boxes within the new layout. The objective function can be used to dynamically adjust a placement location or boundary size of the group bounding box, which can mitigate potential congestion hotspots caused by relatively high group bounding box density.

Figure 6:
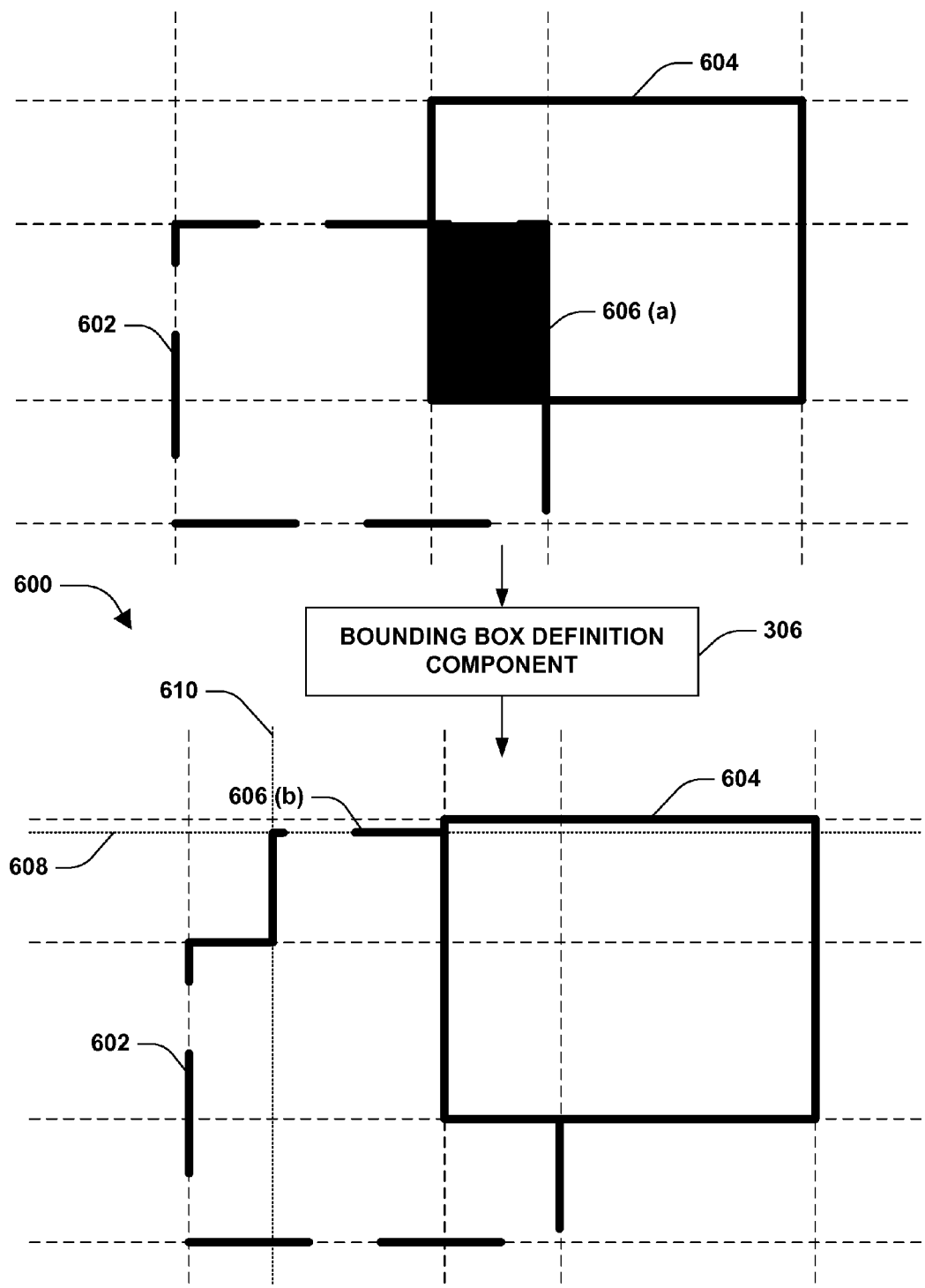
FIG. 6 is an illustration of an example of a group bounding box definition component adjusting a shape of a first group bounding box based upon an overlap with a second group bounding box, according to some embodiments.

Overlap between group bounding boxes can be mitigated by adjusting a shape of a group bounding box. In one example, a shape of a first group bounding box is adjusted based upon an overlap between a first overlap portion of the first group bounding box and a second overlap portion of a second group bounding box. For example, as illustrated in FIG. 6, a first overlap portion of group bounding box 602 positioned at overlap 606 (a) is adjusted to a new position 606 (b) that does not result in overlap. To effect such an adjustment, one or more support cutlines for the first overlap portion are created, for example, based upon the overlap. The one or more support cutlines define a new position, such as a non-overlapping location, at which the first overlap portion is to be shifted to mitigate the overlap. In this way, the first overlap portion is shifted with respect to the one or more supporting cutlines.

A layout script for placement of one or more group bounding boxes within the new layout for the integrated circuit is generated. An electronic design tool can utilize the layout script to create a physical layout for the integrated circuit. The physical layout is based upon the placement of the one or more group bounding boxes. A group bounding box constrains the placement of one or more related cells to a boundary of the group bounding box. Group bounding boxes are placed with respect to one another within the new layout based upon a placement technique, such as the objective function, in order to mitigate timing delay or wire length. In this way, a designer of the integrated circuit does not have to perform a lengthy manual process of iteratively simulating and adjusting the integrate circuit to identify a desired layout.

Figure 2:
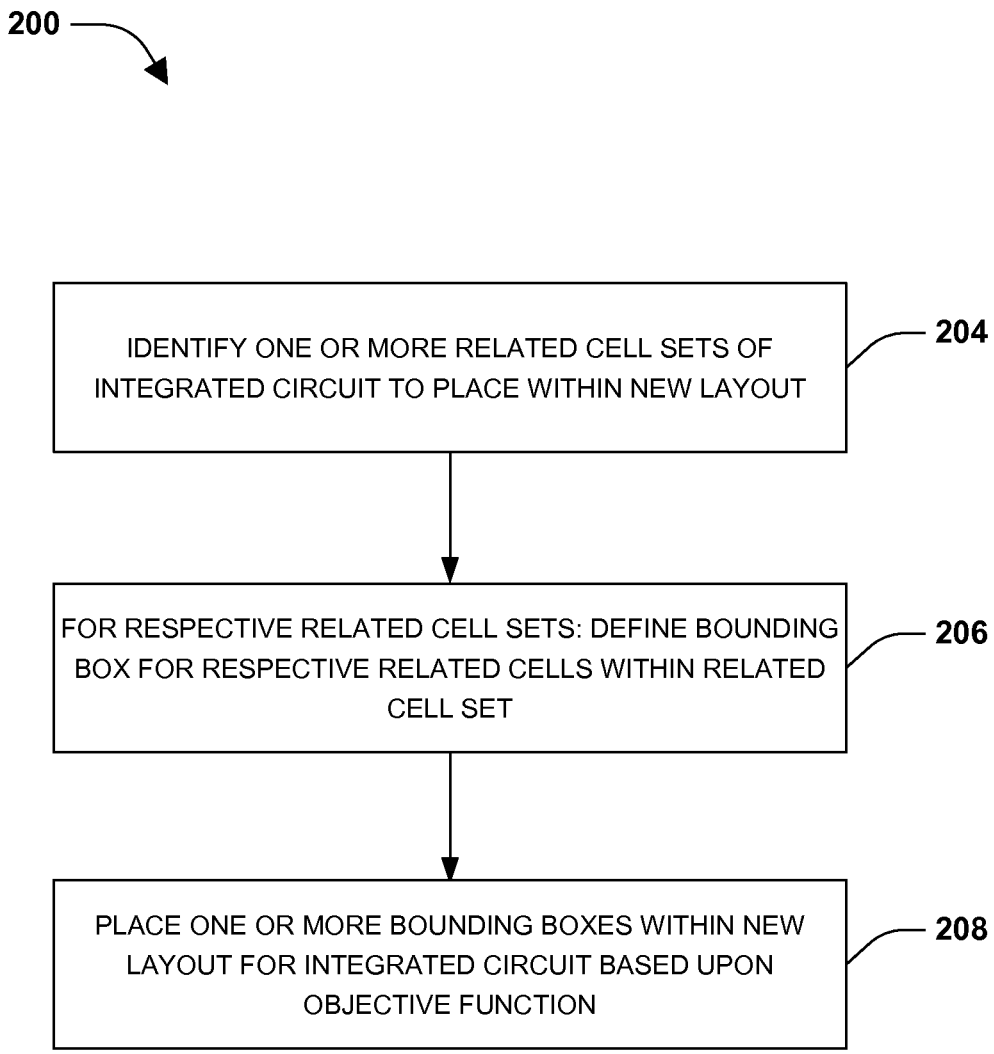
FIG. 2 is a flow diagram illustrating a method of generating a new layout for an integrated circuit, according to some embodiments.

Generating a new layout for an integrated circuit in accordance with various embodiments of the present disclosure is illustrated by an exemplary method 200 in FIG. 2. At 204, one or more related cell sets of an integrated circuit, which are to be placed within a new layout for the integrated circuit, are identified. A related cell set comprises one or more related cells that are to be placed within, or bounded by, a group bounding box. For example, a macro floor plan comprises an initial layout of the one or more related cell sets. However, in one example, the macro floor plan does not comprise finalized locations or sizes for one or more group bounding boxes that are to be placed within the new layout. Instead, a bound configuration file specifies that the one or more related cell sets are to be placed within group bounding boxes within the new layout, which is used to identify the one or more related cell sets.

At 206, for respective related cell sets, a group bounding box is defined for one or more related cells within a related cell set. The group bounding box is defined based upon a centroid, a width, and a height derived from the related cells within the related cell set, such as illustrated in FIG. 4, for example. For example, the centroid comprises an average of center values for the related cells within the related cell set, the width is based upon a square root of a total cell area divided by a bound aspect ratio, for example, and the height is based upon a square root of the total cell area multiplied by the bound aspect ratio, for example. In this way, one or more group bounding boxes are defined for respective related cell sets, such as a first group bounding box for a first related cell set, a second group bounding box for a second related cell set, etc.

At 208, the one or more group bounding boxes are placed within the new layout for the integrated circuit. For example, a location, size, and shape are determined for a group bounding box. In one example of placing a group bounding box, the group bounding box is placed based upon an objective function. The objective function is defined according to an objective and a constraint. The objective is based upon a wire length parameter or a timing parameter, such that wire length or timing delay of the integrated circuit is reduced. The constraint is based upon a density parameter for group bounding box overlap, such that dense areas of cells "congested hot spots" are mitigated to achieve a substantially even "non-congested" distribution of cells within the new layout. In this way, the new layout comprises one or more group bounding boxes that bind cells to particular locations within the new layout to achieve a physical layout for the integrated circuit that mitigates timing delays and wire length.

Figure 3:
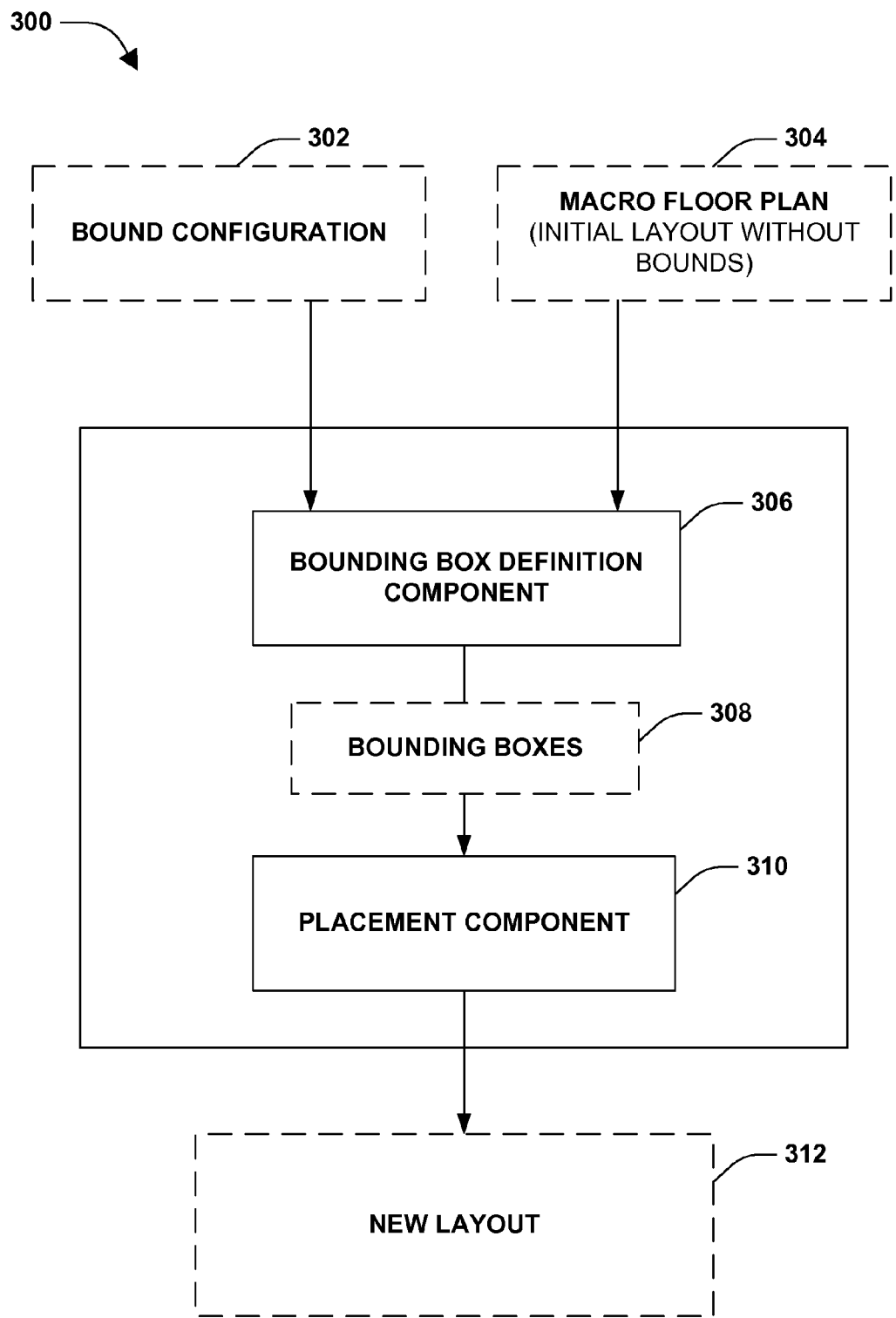
FIG. 3 is component block diagram illustrating a system for generating a new layout for an integrated circuit, according to some embodiments.

FIG. 3 illustrates an example, in accordance with some embodiments, of a system 300 for generating a new layout 312 for an integrated circuit. The system 300 comprises a group bounding box definition component 306 and a placement component 310. The group bounding box definition component 306 is configured to identify one or more related cell sets of an integrated circuit to place within the new layout 312. In an example, a macro floor plan 304 comprises an initial layout of one or more cells of the integrated circuit, but does not comprise bound locations or sizes used to bind the one or more cells. A bound configuration 302 identifies the one or more related cell sets, and specifies that one or more group bounding boxes are to be defined for the one or more related cell sets. In this way, the group bounding box definition component 306 identifies the one or more related cell sets based upon the bound configuration 302 and the macro floor plan 304.

A related cell set comprises one or more related cells, such as registers or computational logic, which are to be placed within a group bounding box. Accordingly, the group bounding box definition component 306 is configured to define group bounding boxes 308 for respective related cell sets. For example, the group bounding box definition component 306 defines a first group bounding box for respective first related cells within a first related cell set based upon a centroid, a width, and a height, such as is illustrated in FIG. 4, for example. The group bounding box definition component 306 defines a boundary for the first group bounding box based upon the centroid, the width, and the height. In this way, the group bounding box definition component 306 binds respective first related cells to the boundary of the first group bounding box, such as illustrated in FIG. 5, for example. Because overlap can occur between the first group bounding box and a second group bounding box, the group bounding box definition component 306 is configured to adjust a shape of the first group bounding box based upon an overlap between a first overlap portion of the first group bounding box and a second overlap portion of the second group bounding box, such as illustrated in FIG. 6, for example.

The placement component 310 is configured to place the group bounding boxes 308 within the new layout 312 for the integrated circuit. In an example, the placement component 310 is configured to place a group bounding box within the new layout 312 based upon a timing path associated with a related cell of the group bounding box. The timing path corresponds to timing information associated with a connection, such as a wire, between the related cell and a second related cell of a second group bounding box, which can affect timing and performance of the integrated circuit. Accordingly, the placement component 310 places the group bounding box within the new layout 312, such that timing delay of the timing path is reduced. For example, the placement component 310 places the group bounding box at a placement location or sizes the group bounding box to a size or shape that reduces a length of the wire that connects the related cell and the second related cell. In another example, the placement component 310 is configured to place the group bounding boxes 308 according to an objective function that is defined based upon an objective and a constraint. The objective is based upon a wire length parameter or a timing parameter, such that wire lengths or timing delay of the integrated circuit are reduced. The constraint is based upon a density parameter for group bounding box overlap, such that dense areas of cells are reduced to achieve a substantially even distribution of cells within the new layout 312. In this way, the new layout 312 comprises one or more group bounding boxes that bind cells to particular locations within the new layout 312 to achieve a physical layout for the integrated circuit that mitigates timing delays and wire length, for example.

FIG. 4 illustrates an example 400, in accordance with some embodiments, of a first group bounding box 412 and a second group bounding box 428. A macro floor plan for an integrated circuit can comprise an initial layout of one or more cells, such as a register or computational logic. An electronic design tool can use the macro floor plan to create a new layout comprising a physical layout of the cells, which can be used for simulation or fabrication. In conventional design techniques, a designer can manually specify a group bounding box for one or more related cells within a layout. The layout can be simulated to identify how the group bounding box impacts timing of the integrated circuit. Unfortunately, the designer may iteratively adjust a placement location or size of the group bounding box based upon one or more simulations, which can greatly increase the design time for the integrated circuit. Accordingly, as provided herein, one or more group bounding boxes can be automatically defined, placed, and sized in a new layout that can reduce timing delays of the integrated circuit without the designer manually adjusting group bounding boxes and simulating a layout.

In an example of identifying a group bounding box, a first related cell set comprising a first cell 402, a second cell 404, a third cell 406, a fourth cell 408, and a fifth cell 410 is identified. A first centroid 414 of the first related cell set is identified based upon an average of center values of the first cell 402, the second cell 404, the third cell 406, the fourth cell 408, and the fifth cell 410. A width 416 w for the group bounding box 412 is identified as a square root of a total cell area $A_{sum}$ divided by a bound aspect ratio "p=Height/Width", such that the width 416

$$w = \sqrt{\frac{Asum}{p}}.$$

A height 418 h for the group bounding box is identified as a square root of the total cell area $A_{sum}$ multiplied by the bound aspect ratio p, such that the height 418

$$h = \sqrt{Asum \times p}.$$

In this way, a boundary for the first group bounding box 412 is defined based upon the centroid 414, the width 416, and the height 418. The first cell 402, the second cell 404, the third cell 406, the fourth cell 408, and the fifth cell 410 can be projected, at virtual pins, along the boundary of the first group bounding box 412, such as is illustrated in, FIG. 5, for example. In an example, merely the fourth cell 408 and the fifth cell 410 are projected along the boundary because the fourth cell 408 and the fifth cell 410 comprise registers.

In an example of identifying a group bounding box, a second related cell set comprising a sixth cell 420, a seventh cell 422, an eighth cell 424, and a ninth cell 426 is identified. A second centroid 430 of the second related cell set is identified based upon an average of center values of the sixth cell 420, the seventh cell 422, the eighth cell 424, and the ninth cell 426. A second width 432 w for the second group bounding box 428 is identified as a square root of a second total cell area $A_{sum}$ divided by a second bound aspect ratio p, such that the second width 432

$$w = \sqrt{\frac{Asum}{p}}.$$

A second height 434 h for the second group bounding box is identified as a square root of the second total cell area $A_{sum}$ multiplied by the second bound aspect ratio p, such that the second height 434

$$h = \sqrt{Asum \times p}.$$

In this way, a second boundary for the second group bounding box 428 is defined based upon the second centroid 430, the second width 432, and the second height 434. The sixth cell 420, the seventh cell 422, the eighth cell 424, and the ninth cell 426 can be projected, at virtual pins, along the second boundary of the second group bounding box 428, such as is illustrated in FIG. 5, for example). In an example, merely the eighth cell 424 and the ninth cell 426 are projected along the boundary because the eighth cell 424 and the ninth cell 426 comprise registers.

FIG. 5 illustrates an example 500, in accordance with some embodiments, of identifying a first timing path 512 and a second timing path 514. A first group bounding box 412 is associated with a fourth cell 408, such as a first register, a fifth cell 410, such as a second register, and other related cells, such as are illustrated in FIG. 4, for example. The first group bounding box 412 comprises a boundary, illustrated by a dotted line of the first group bounding box 412. The fourth cell 408 is projected to a first virtual pin 502 along the boundary, and the fifth cell 410 is projected to a second virtual pin 504 along the boundary. In an example, the fourth cell 408 and the fifth cell 410 retain their original locations with respect to the first group bounding box 412 because the fourth cell 408 and the fifth cell 410 are already located along the boundary.

A second group bounding box 428 is associated with an eighth cell 424, such as a third register, and a ninth cell 426, such as a fourth register, and other related cells, such as are illustrated in FIG. 4, for example. The second group bounding box 428 comprises a second boundary, illustrated by a dotted line of the second group bounding box 428. The eighth cell 424 is projected to a third virtual pin 506 along the boundary, and the ninth cell 426 is projected to a fourth virtual pin 510 along the second boundary. In an example, the eighth cell 424 retains its original location with respect to the second group bounding box 428 because the eighth cell 424 is already located along the second boundary. However, the ninth cell 426 is moved from an original location to a new location at the fourth virtual pin 510 because the ninth cell 426 is located outside the second boundary. For example, the new location is defined along the second boundary based upon a point along the second boundary that is associated with a projection 508 from a centroid 430 of the second group bounding box 428 through the point along the second boundary to the ninth cell 426. In this way, the ninth cell 426 is relocated to the fourth virtual pin 510 along the second boundary.

In an example of identifying a timing path, the first timing path 512 is identified based upon a first connection, such as through a wire or logic, between the fourth cell 408 of the first group bounding box 412 and the eighth cell 424 of the second group bounding box 428. A second timing path 514 is identified based upon a second connection, such as through a wire or logic, between the fifth cell 410 of the first group bounding box 412 and the ninth cell 426, at the fourth virtual pin 510, of the second group bounding box 428. In this way, the first timing path 512 and the second timing 514 are used to place or size the first group bounding box 412 and the second group bounding box 428 within a new layout in order to reduce signal timing delays along the first timing path 512 and the second timing path 514. In one example, an objective function that takes into account a wire length parameter or a timing parameter that are based upon the first timing path 512 and the second timing path can be applied to the first group bounding box 412 and the second group bounding box 428 in order to place such group bounding boxes within the new layout. In order to mitigate overlap of group bounding boxes, the objective function can take into account a density parameter to mitigate congested hot spots comprising a density or overlap of cells above a threshold value.

FIG. 6 illustrates an example 600, in accordance with some embodiments, of a group bounding box definition component 306 adjusting a shape of a first group bounding box 602 based upon an overlap 606 (a) with a second group bounding box 604. For illustrative purposes, the first group bounding box 602 is illustrated as a bold dashed line, the second group bounding box 604 is illustrated as a bold solid line, the overlap 606 (a) is illustrated as a dark rectangle, and one or more cutlines are illustrated as thin dashed lines. The one or more cutlines are placed along edges of the first group bounding box 602 and the second group bounding box 604 to define shapes of the first and second group bounding boxes.

In an example of adjusting the first group bounding box 602, the group bounding box definition component 306 identifies the overlap 606 (a) between a first overlap portion of the first group bounding box 602 and a second overlap portion of the second group bounding box 604. The group bounding box definition component 306 determines one or more supporting cutlines that can be used to shift the first overlap portion of the first group bounding box 602 to reduce the overlap 606 (a). It is appreciated that different sets of supporting cutlines can be determined because the first overlap portion can be adjusted in one or more ways to reduce the overlap 606 (a). In this way, a particular set of supporting cutlines can be used to shift the first overlap portion, such that timing delay or wire length can be mitigated. In an example, a first supporting cutline 608 and a second supporting cutline 610 are used to shift the first overlap portion to a new position 606 (b), thus resulting in a new shape of the first group bounding box 602 that does not overlap the second group bounding box 604. In this way, timing delay can be mitigated by reducing cell overlap that can cause congested hotspots of cells.

According to an aspect of the instant disclosure, a method for defining a group bounding box for one or more cells of an integrated circuit is provided. The method comprises receiving a macro floor plan for the integrated circuit. The macro floor plan comprises an initial layout of the integrated circuit. A group bounding box for one or more first related cells of the initial layout is defined. The group bounding box can be placed within a new layout at a particular location, size, and shape to mitigate timing delay of the integrated circuit.

According to an aspect of the instant disclosure, a system for generating a new layout for an integrated circuit is provided. The system comprises a group bounding box definition component. The group bounding box definition component is configured to identify one or more related cell sets of the integrated circuit to place within a new layout for the integrated circuit. A related cell set comprises one or more related cells to place within a group bounding box, such as along a boundary of the group bounding box. For respective related cell sets, the group bounding box definition component is configured to define a group bounding box for respective related cells within a related cell set. The system comprises a placement component configured to place one or more group bounding boxes within the new layout for the integrated circuit. For example, a group bounding box can be placed within the new layout at a particular location, size, and shape to mitigate timing delay of the integrated circuit.

According to an aspect of the instant disclosure, a method for generating a new layout for an integrated circuit is provided. The method comprises identifying one or more related cell sets of the integrated circuit to place within the new layout for the integrated circuit. A related cell set comprises one or more related cells to place within a group bounding box. For respective related cell sets, a group bounding box is defined for respective related cells within a related cell set based upon a centroid, a width, and a height derived from respective related cells within the related cell set. One or more group bounding boxes are placed within the new layout based upon an objective function defined according to an objective and a constraint. The objective is based upon at least one of a wire length parameter or a timing parameter. The constraint is based upon a density parameter for group bounding box overlap. In this way, the new layout is generated.

Figure 7:
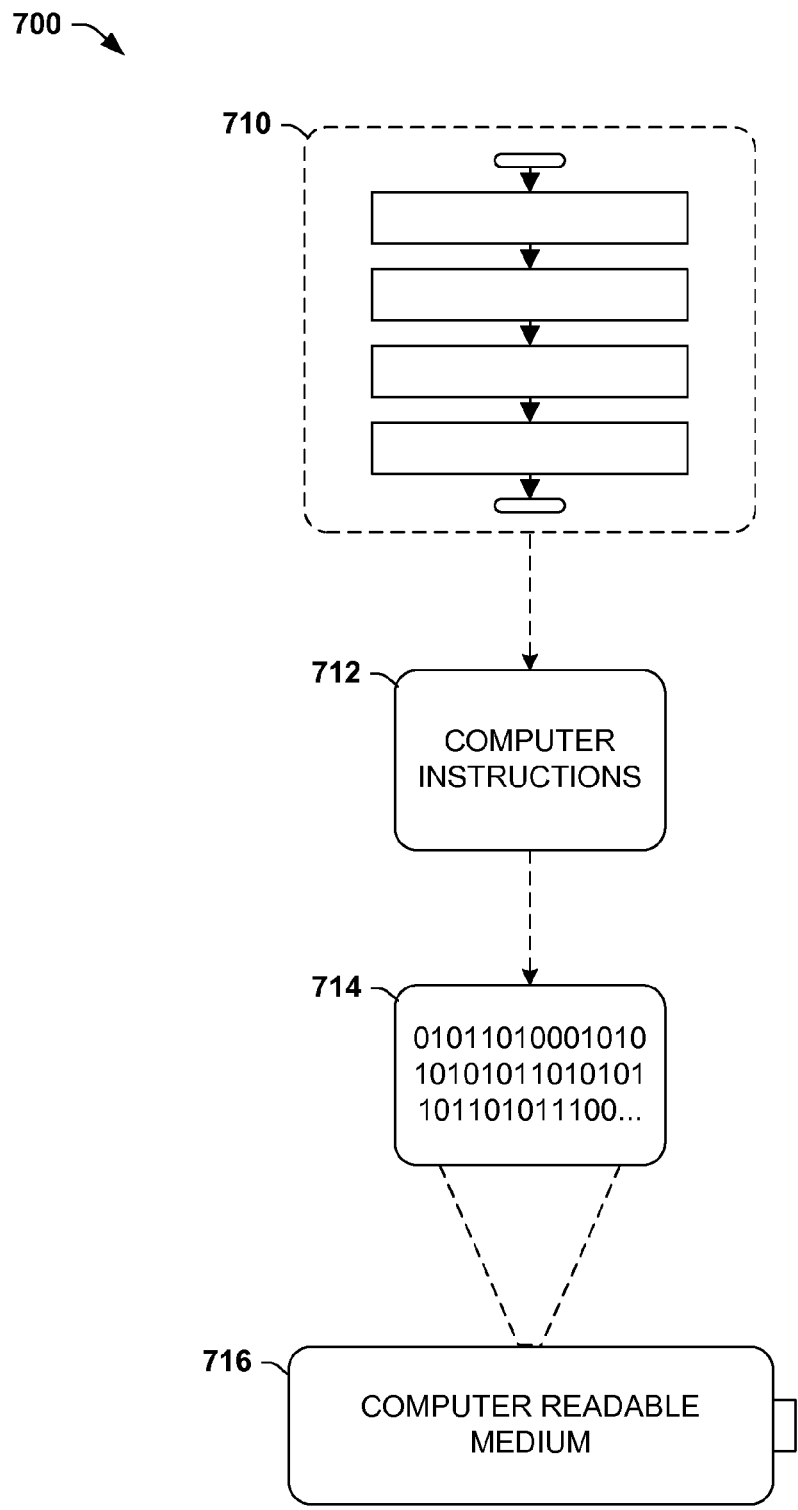
FIG. 7 is an illustration of an example computer-readable medium wherein processor-executable instructions configured to embody one or more of the provisions set forth herein may be comprised.

Still another embodiment involves a computer-readable medium comprising processor-executable instructions configured to implement one or more of the techniques presented herein. An exemplary computer-readable medium that may be devised in these ways is illustrated in FIG. 7, wherein the implementation 700 comprises a computer-readable medium 716 (e.g., a CD-R, DVD-R, flash drive, a platter of a hard disk drive, etc.), on which is encoded computer-readable data 714. This computer-readable data 714 in turn comprises a set of computer instructions 712 configured to operate according to one or more of the principles set forth herein. In one such embodiment 700, the processor-executable computer instructions 712 may be configured to perform a method 710, such as at least some of the exemplary method 100 of FIG. 1 and/or at least some of exemplary method 200 of FIG. 2, for example. In another such embodiment, the processor-executable instructions 712 may be configured to implement a system, such as at least some of the exemplary system 300 of FIG. 3, for example. Many such computer-readable media may be devised by those of ordinary skill in the art that are configured to operate in accordance with the techniques presented herein.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

As used in this application, the terms "component," "module," "system", "interface", and the like are generally intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on a controller and the controller can be a component. One or more components may reside within a process and/or thread of execution and a component may be localized on one computer and/or distributed between two or more computers.

Furthermore, the claimed subject matter may be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, carrier, or media. Of course, those skilled in the art will recognize many modifications may be made to this configuration without departing from the scope or spirit of the claimed subject matter.

Figure 8:
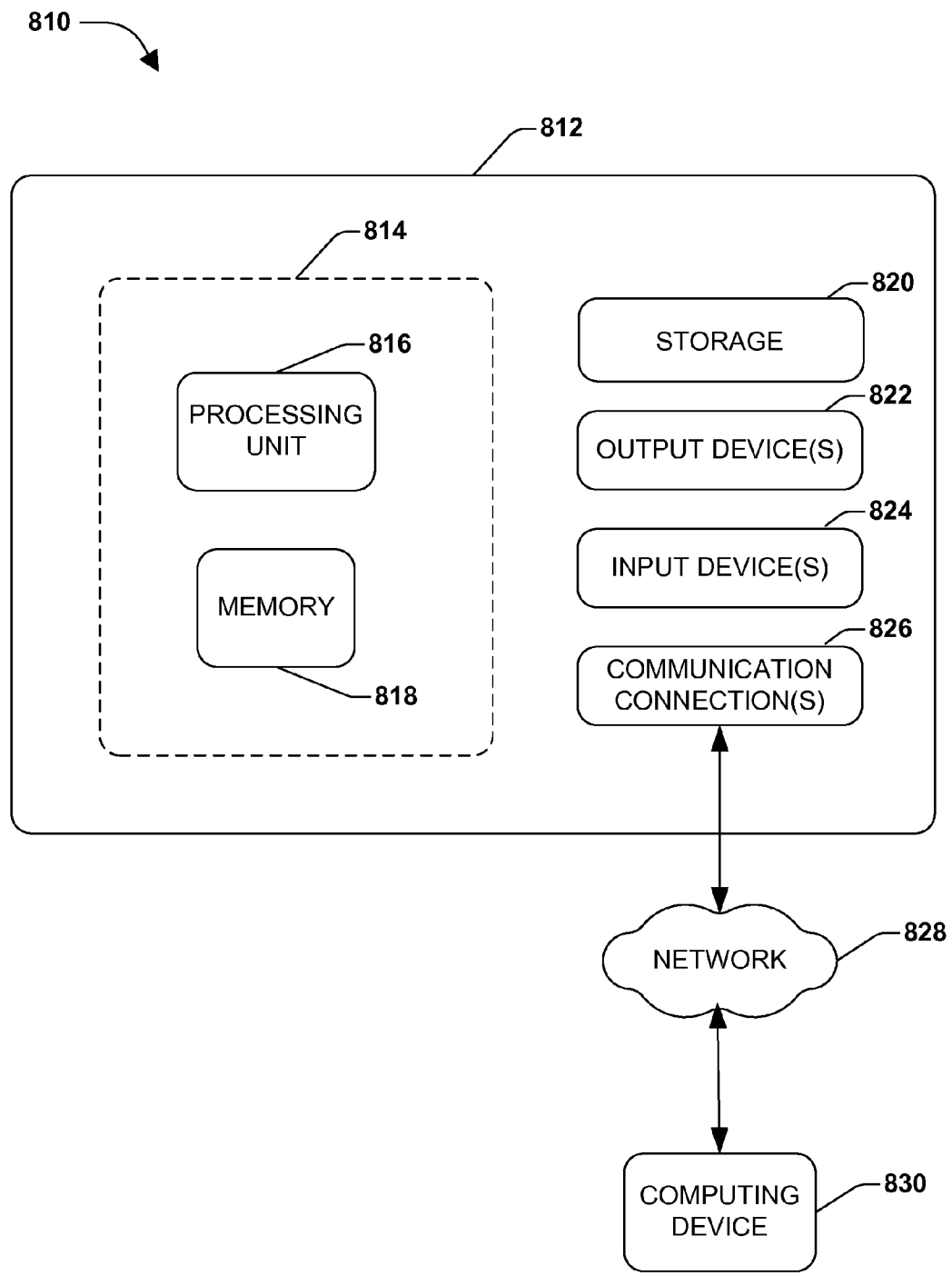
FIG. 8 illustrates an example computing environment wherein one or more of the provisions set forth herein may be implemented.

FIG. 8 and the following discussion provide a brief, general description of a suitable computing environment to implement embodiments of one or more of the provisions set forth herein. The operating environment of FIG. 8 is only one example of a suitable operating environment and is not intended to suggest any limitation as to the scope of use or functionality of the operating environment. Example computing devices include, but are not limited to, personal computers, server computers, hand-held or laptop devices, mobile devices (such as mobile phones, Personal Digital Assistants (PDAs), media players, and the like), multiprocessor systems, consumer electronics, mini computers, mainframe computers, distributed computing environments that include any of the above systems or devices, and the like.

Although not required, embodiments are described in the general context of "computer readable instructions" being executed by one or more computing devices. Computer readable instructions may be distributed via computer readable media (discussed below). Computer readable instructions may be implemented as program modules, such as functions, objects, Application Programming Interfaces (APIs), data structures, and the like, that perform particular tasks or implement particular abstract data types. Typically, the functionality of the computer readable instructions may be combined or distributed as desired in various environments.

FIG. 8 illustrates an example of a system 810 comprising a computing device 812 configured to implement one or more embodiments provided herein. In one configuration, computing device 812 includes at least one processing unit 816 and memory 818. Depending on the exact configuration and type of computing device, memory 818 may be volatile (such as RAM, for example), non-volatile (such as ROM, flash memory, etc., for example) or some combination of the two. This configuration is illustrated in FIG. 8 by dashed line 814.

In other embodiments, device 812 may include additional features and/or functionality. For example, device 812 may also include additional storage (e.g., removable and/or non-removable) including, but not limited to, magnetic storage, optical storage, and the like. Such additional storage is illustrated in FIG. 8 by storage 820. In some embodiments, computer readable instructions to implement one or more embodiments provided herein may be in storage 820. Storage 820 may also store other computer readable instructions to implement an operating system, an application program, and the like. Computer readable instructions may be loaded in memory 818 for execution by processing unit 816, for example.

The term "computer readable media" as used herein includes computer storage media. Computer storage media includes volatile and nonvolatile, removable and non-removable media implemented in any method or technology for storage of information such as computer readable instructions or other data. Memory 818 and storage 820 are examples of computer storage media. Computer storage media includes, but is not limited to, RAM, ROM, EEPROM, flash memory or other memory technology, CD-ROM, Digital Versatile Disks (DVDs) or other optical storage, magnetic cassettes, magnetic tape, magnetic disk storage or other magnetic storage devices, or any other medium which can be used to store the desired information and which can be accessed by device 812. Any such computer storage media may be part of device 812.

The term "computer readable media" may include communication media. Communication media typically embodies computer readable instructions or other data in a "modulated data signal" such as a carrier wave or other transport mechanism and includes any information delivery media. The term "modulated data signal" may include a signal that has one or more of its characteristics set or changed in such a manner as to encode information in the signal.

Device 812 may include input device(s) 824 such as keyboard, mouse, pen, voice input device, touch input device, infrared cameras, video input devices, and/or any other input device. Output device(s) 822 such as one or more displays, speakers, printers, and/or any other output device may also be included in device 812. Input device(s) 824 and output device(s) 822 may be connected to device 812 via a wired connection, wireless connection, or any combination thereof. In some embodiments, an input device or an output device from another computing device may be used as input device(s) 824 or output device(s) 822 for computing device 812. Device 812 may also include communication connection(s) 826 to facilitate communications with one or more other devices.

Various operations of embodiments are provided herein. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally to be construed to mean "one or more" unless specified otherwise or clear from context to be directed to a singular form. Also, at least one of A and B or the like generally means A or B or both A and B. Furthermore, to the extent that "includes", "having", "has", "with", or variants thereof are used in either the detailed description or the claims, such terms are intended to be inclusive in a manner similar to "comprising".

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims.

What is claimed is:

1. A method, comprising:
  receiving a macro floor plan for an integrated circuit comprising a first set of related cells, the macro floor plan comprising a first layout of the integrated circuit;
  defining a group bounding box for the first set of related cells, wherein a first related cell of the first set of related cells is positioned outside a boundary of the group bounding box;
  generating a projection line between a centroid for the first set of related cells and a central region of the first related cell; and
  projecting a first virtual pin for the first related cell at an intersection of the projection line and the boundary, at least some of the method implemented at least in part via a processing unit.

2. The method of claim 1, the defining a group bounding box comprising:
identifying the centroid based upon an average of center values of the first set of related cells;
identifying a width for the group bounding box based upon a total cell area and a bound aspect ratio; and
identifying a height for the group bounding box based upon the total cell area and the bound aspect ratio.

3. The method of claim 1, comprising:
defining a second group bounding box for a second set of related cells of the integrated circuit.

4. The method of claim 3, comprising:
identifying a timing path between the first related cell and a second related cell of the second set of related cells.

5. The method of claim 4, the identifying a timing path comprising:
projecting a second virtual pin for the second related cell along a second boundary of the second group bounding box, wherein the timing path extends between the first virtual in and the second virtual pin.

6. The method of claim 2, comprising:
defining the boundary based upon the centroid, the width, and the height.

7. The method of claim 4, the first related cell comprising a first register and the second related cell comprising a second register.

8. The method of claim 1, comprising:
determining a placement for the group bounding box within a second layout of the integrated circuit based upon a timing path associated with the first related cell.

9. The method of claim 8, the determining a placement comprising:
defining an objective based upon at least one of a wire length parameter or a timing parameter;
defining a constraint based upon a density parameter for group bounding box overlap;
defining an objective function based upon the objective and the constraint; and
applying the objective function to the group bounding box to determine the placement for the group bounding box.

10. The method of claim 9, the applying the objective function comprising:
dynamically adjusting a bound size of the group bounding box based upon the objective function.

11. The method of claim 1, comprising:
adjusting a shape of the group bounding box based upon an overlap between a first overlap portion of the group bounding box and a second overlap portion of a second group bounding box.

12. The method of claim 11, the adjusting a shape comprising:
defining one or more supporting cutlines for the first overlap portion based upon the overlap; and
shifting the first overlap portion with respect to the one or more supporting cutlines.

13. The method of claim 1, comprising:
generating a layout script for placement of the group bounding box within a second layout of the integrated circuit.

14. The method of claim 1, the defining a group bounding box comprising:
identifying the first set of related cells based upon a bound configuration for the macro floor plan.

15. A system, comprising:
one or more processing units; and
memory configured to store instructions that when executed by at least one of the one or more processing units perform operations, comprising:
defining, based upon a first layout of an integrated circuit, a group bounding box for a first set of related cells of the integrated circuit, wherein a first related cell of the first set of related cells is positioned outside a boundary of the group bounding box;
generating a projection line between a centroid for the first set of related cells and a central region of the first related cell; and
projecting a first virtual in for the first related cell at an intersection of the projection line and the boundary.

16. The system of claim 15, the operations comprising:
generating a second layout based upon a timing path extending between the first virtual pin and a second virtual pin for a second related cell of a second set of related cells associated with a second group bounding box.

17. The system of claim 15, the operations comprising:
identifying the centroid for the first set of related cells;
identifying a width for the group bounding box based upon a total cell area and a bound aspect ratio; and
identifying a height for the group bounding box based upon the total cell area and the bound aspect ratio.

18. The system of claim 15, the operations comprising:
adjusting a shape of the group bounding box based upon an overlap between a first overlap portion of the group bounding box and a second overlap portion of a second group bounding box.

19. The system of claim 15, the operations comprising:
defining an objective based upon at least one of a wire length parameter or a timing parameter;
defining a constraint based upon a density parameter for group bounding box overlap;
defining an objective function based upon the objective and the constraint; and
applying the objective function to the group bounding box to determine a placement for the group bounding box within a second layout of the integrated circuit.

20. A non-transient computer-readable medium comprising processor-executable instructions that when executed perform a method, comprising:
defining, based upon a first layout of an integrated circuit, a group bounding box for a first set of related cells of the integrated circuit, wherein a first related cell of the first set of related cells is positioned outside a boundary of the group bounding box;
generating a projection line between a centroid for the first set of related cells and a central region of the first related cell; and
projecting a first virtual in for the first related cell at an intersection of the projection line and the boundary.

* * * * *